United States Patent
Lu et al.

(10) Patent No.: US 8,344,445 B2
(45) Date of Patent: Jan. 1, 2013

(54) NON-VOLATILE SEMICONDUCTOR MEMORY CELL WITH DUAL FUNCTIONS

(75) Inventors: Hau-Yan Lu, Hsinchu (TW);
Hsin-Ming Chen, Hsinchu (TW);
Ching-Sung Yang, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/414,734

(22) Filed: Mar. 8, 2012

(65) Prior Publication Data

US 2012/0163072 A1    Jun. 28, 2012

Related U.S. Application Data

(63) Continuation-in-part of application No. 12/633,780, filed on Dec. 8, 2009, now Pat. No. 8,174,063.

(60) Provisional application No. 61/502,336, filed on Jun. 29, 2011, provisional application No. 61/230,099, filed on Jul. 30, 2009.

(51) Int. Cl.
*H01L 29/788* (2006.01)

(52) U.S. Cl. .................... 257/324; 257/314; 257/315

(58) Field of Classification Search .......... 257/314–316, 257/324
See application file for complete search history.

(56) References Cited

U.S. PATENT DOCUMENTS

| 7,227,234 | B2 | 6/2007 | Roizin | |
|---|---|---|---|---|
| 7,294,888 | B1 | 11/2007 | Paak | |
| 7,456,465 | B2 * | 11/2008 | Prinz et al. | 257/315 |
| 7,811,886 | B2 * | 10/2010 | Winstead et al. | 438/261 |
| 2006/0008992 | A1 | 1/2006 | Shukuri | |
| 2008/0188052 | A1 * | 8/2008 | Winstead et al. | 438/299 |
| 2010/0244120 | A1 * | 9/2010 | Kang et al. | 257/325 |

* cited by examiner

*Primary Examiner* — Thanh Nguyen
(74) *Attorney, Agent, or Firm* — Winston Hsu; Scott Margo (57) ABSTRACT

A non-volatile semiconductor memory cell with dual functions includes a substrate, a first gate, a second gate, a third gate, a charge storage layer, a first diffusion region, a second diffusion region, and a third diffusion region. The second gate and the third gate are used for receiving a first voltage corresponding to a one-time programming function of the dual function and a second voltage corresponding to a multi-time programming function of the dual function. The first diffusion region is used for receiving a third voltage corresponding to the one-time programming function and a fourth voltage corresponding to the multi-time programming function. The second diffusion region is used for receiving a fifth voltage corresponding to the multi-time programming function.

7 Claims, 12 Drawing Sheets

NON-VOLATILE SEMICONDUCTOR MEMORY CELL WITH DUAL FUNCTIONS

CROSS REFERENCE TO RELATED APPLICATIONS

This application claims the benefit of U.S. provisional application No. 61/502,336, filed on Jun. 29, 2011 and entitled "Dual functional Non-volatile Semiconductor Memory," and is a continuation-in-part of U.S. patent application Ser. No. 12/633,780, filed on Dec. 8, 2009 and entitled "NON-VOLATILE SEMICONDUCTOR MEMORY DEVICE WITH INTRINSIC CHARGE TRAPPING LAYER," which claims the benefit of U.S. provisional application No. 61/230,099, filed on Jul. 30, 2009 and entitled "Semiconductor Non-volatile Memory." The disclosures of the prior applications are incorporated herein by reference herein in their entirety.

BACKGROUND OF THE INVENTION

1. Field of the Invention

The present invention relates to a non-volatile semiconductor memory cell, and more particularly to a non-volatile semiconductor memory cell with dual functions.

2. Description of the Prior Art

Non-volatile memory is a type of memory that retains information even when power is not supplied to memory blocks thereof. Some examples include magnetic devices, optical discs, flash memory, and other semiconductor-based memory technologies. Non-volatile memory can be classified by the reprogrammable capability. For example, some non-volatile memory could be programmed only once (one time programmable ROM, OTP ROM), and other types may be programmed and reprogrammed multiple times. Considering the fabrication and process, the nonvolatile memory technology can be specified as the standalone and embedded memory one. As semiconductor memory technologies move forward, embedded non-volatile memory is able to come out an advantage that the ability to embed substantial amounts of memory cells into integrated circuits (ICs). In other words, the embedded memory cells are formed in the same process with the ICs. No complex and expensive fabrication steps are the key feature of the embedded non-volatile memory. These non-volatile memory technologies are also classified as the "CMOS non-volatile memory" or "logic non-volatile memory".

Figure 1:
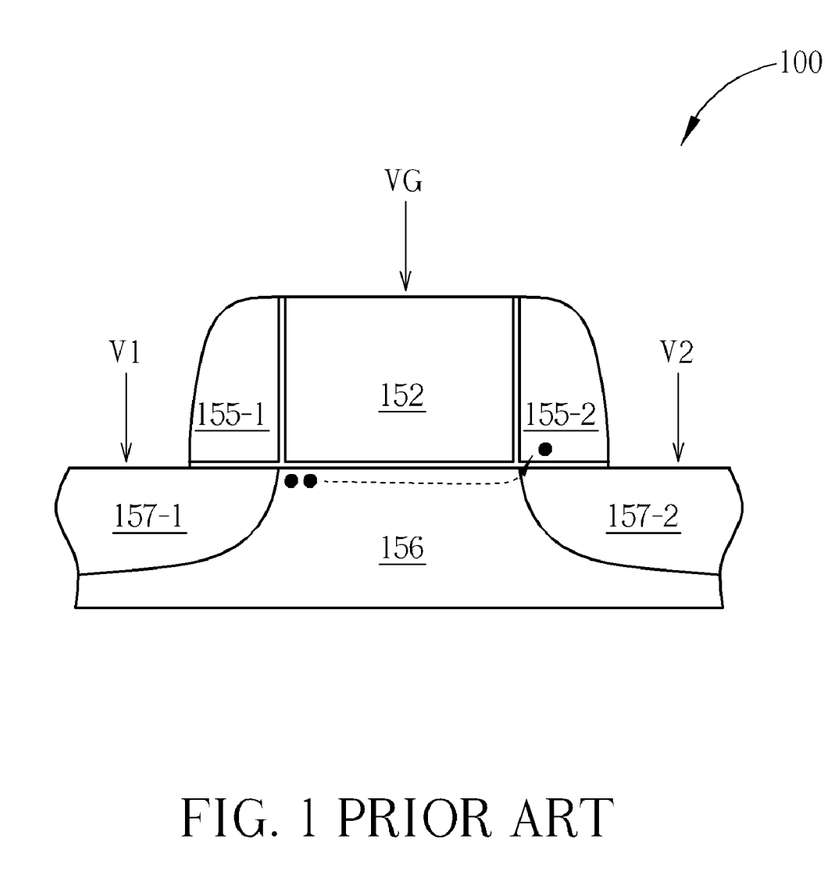
FIG. 1 is a diagram of a semiconductor memory transistor according to the prior art.

One goal of non-volatile memory devices is to fit increasing numbers of memory cells in smaller chip areas while utilizing the same fabrication process as other complementary metal-oxide-semiconductor (CMOS) devices in the IC. One method for increasing the number of memory cells utilizes "charge storage structures" to form 2-bit non-volatile semiconductor memory transistors. Please refer to FIG. 1, which is a diagram of a semiconductor memory transistor 100 according to the prior art. The semiconductor memory transistor 100 is formed on a substrate, which has two implanted source/drain regions 157-1 and 157-2 and a channel region 156. The channel region 156 and the implanted source/drain regions 157-1, 157-2 are formed under a gate region 152, and two charge storage structures 155-1 and 155-2 formed on either side of the gate region 152. The charge storage structures 155-1, 155-2 are made of a spacer material that has charge trapping properties, e.g. silicon-nitride or a high-k dielectric. The charge storage structure 155-2 is programmed by applying a gate voltage VG of 5 Volts and a drain voltage V2 of 5 Volts, with a source voltage V1 of 0 Volts. Thus, channel hot electrons from the source region 157-1 may enter the charge storage region 155-2 by traveling through the channel region 156. To erase the charge storage structure 155-2, a gate voltage VG of −5 Volts and a drain voltage V2 of −5 Volts may be applied, inducing band-to-band tunneling holes to enter the charge storage structure 155-2.

Figure 2:
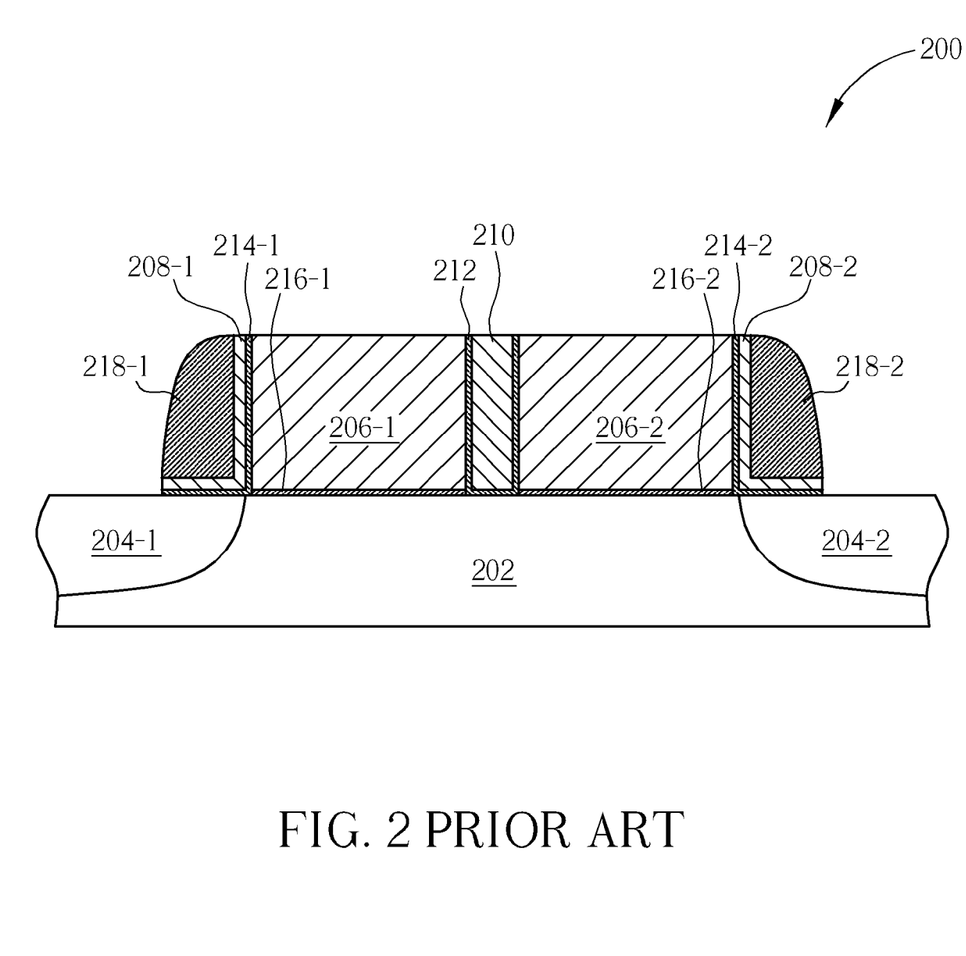
FIG. 2 is a diagram of a CMOS non-volatile memory cell according to the prior art.

Another technique for providing a CMOS non-volatile memory cell that is fabricated using standard CMOS processes is shown in FIG. 2, which is a diagram of a CMOS non-volatile memory cell 200 ("memory cell 200" hereinafter) according to the prior art. The memory cell 200 is fabricated on a substrate 202, has two source/drain regions 204-1 and 204-2, and two poly gates 206-1 and 206-2 separated from the substrate 202 by gate dielectric layers 208-1 and 208-2, respectively. The gate dielectric layers 208-1/208-2 are formed of oxide-nitride-oxide (ONO) material. A programming layer 210 is formed between the two poly gates 206-1, 206-2, and is isolated from the two poly gates 206-1, 206-2 by an isolating layer 212. The programming layer 210 provides charge storage similar to a silicon-oxide-nitride-oxide-silicon (SONOS) structure utilized in flash memory cells. However, in the CMOS non-volatile memory cell 200, the two poly gates 206-1, 206-2 are utilized to program the programming layer 210. Silicon-nitride sidewall spacers 214-1 and 214-2 are deposited with the programming layer 210 for controlling e-field fringing near the source/drain regions 204-1, 204-2. Sidewall isolating layers 216-1 and 216-2 are grown with the isolating layer 212, and isolate the SiN sidewall spacers 214-1, 214-2 from the poly gates 206-1, 206-2 and the substrate 202. Second sidewall spacers 218-1, 218-2 are formed from silicon oxide. The programming layer 210 is programmed by grounding the poly gate 206-1, and leaving the source/drain regions 204-1, 204-2 and substrate 202 floating. A high voltage is applied to the poly gate 206-2 to attract electrons from the poly gate 206-1 into the programming layer 210 through the isolating layer 212. The negative charge of the programming layer 210 over the channel causes a negative bias, increasing threshold voltage of the memory cell 200 relative to non-programmed transistors in the same circuit.

Many various topologies are provided in the prior art for forming memory cells with charge storage layers. However, the memory cells are slow and inefficient.

SUMMARY OF THE INVENTION

According to a first embodiment of the present invention, a non-volatile semiconductor memory cell with dual functions comprises a substrate of a first conductivity type comprising an active region, a first gate, a second gate, a third gate, a charge storage layer filled between the second gate and the third gate, a first diffusion region, a second diffusion region, and a third diffusion region. The first gate is formed fully on the active region for a receiving a select-gate voltage. The second gate is formed partially on the active region on a first side of the first gate for receiving a first voltage corresponding to a one-time programming function of the dual function and a second voltage corresponding to a multi-time programming function of the dual function, wherein the first gate and the second gate are separated by a first distance. The third gate is formed partially on the active region on the first side of the first gate for receiving the first voltage corresponding to the one-time programming function and the second voltage corresponding to the multi-time programming function, wherein the first gate and the third gate are separated by the first distance, and the second gate and the third gate are separated by a second distance. The charge storage layer is formed on the substrate, and fills between the second gate and the third gate. The first diffusion region is a second conductivity type opposite the first conductivity type formed on the surface of the active region on a second side of the first gate opposite the first side of the first gate for receiving a third voltage corresponding to the one-time programming function and a fourth voltage corresponding to the multi-time programming function. The second diffusion region is the second conductivity type formed on the surface of the active region on a first side of the second gate opposite the first side of the first gate for receiving a fifth voltage corresponding to the multi-time programming function. The third diffusion region is the second conductivity type formed on the surface of the active region between the first gate and the second/third gate.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 3, which is a diagram of a complementary metal-oxide-semiconductor (CMOS) non-volatile memory cell 300 (hereinafter "the memory cell 300") according to an embodiment of the present invention. The memory cell 300 may be formed over an active region 315 in a P-well region 310 of a substrate. Although CMOS P-well topology is described, the embodiments described herein are also suitable for application to CMOS N-well topology. A first N+ diffusion region 311-1 may be formed on a surface of the active region 315 on a left (second) side of a first polysilicon gate 313-1, a second N+ diffusion region 311-2 may be formed on the surface of the active region 315 on a first side of a second polysilicon gate 313-2 opposite a right (first) side of the first polysilicon gate 313-1, and a third N+ diffusion region 311-3 may be formed on the surface of the active region 315 between the first polysilicon gate 313-1 and the second polysilicon gate 313-2.

The second polysilicon gate 313-2 and the third polysilicon gate 313-3 may be formed a second distance apart from each other. Further, the second polysilicon gate 313-2 and the third polysilicon gate 313-3 may both be formed a first distance apart from the first polysilicon gate 313-1. The second distance and the first distance may be measured along perpendicular axes. The second distance may be of a size suitable for forming a charge storage (self-aligning nitride, SAN) layer 314 in a space between the second and third polysilicon gates 313-2, 313-3, and the second distance may be of a size suitable for not forming an SAN layer between the first polysilicon gate 313-1 and the second and third polysilicon gates 313-2, 313-3. For example, in a 90 nm/65 nm node, a range of 20 nm to 200 nm of separation between the second and third polysilicon gates 313-2, 313-3 may allow formation of the charge storage layer 314, e.g. the SAN layer, in the space between the second and third polysilicon gates 313-2, 313-3. Contacts 316-1 and 316-2 may be formed in the active region 315 over the diffusion regions 311-1 and 311-2, respectively, for charging the diffusion regions 311-1, 311-2 with voltage signals applied to the contacts 316-1, 316-2.

Figure 4:
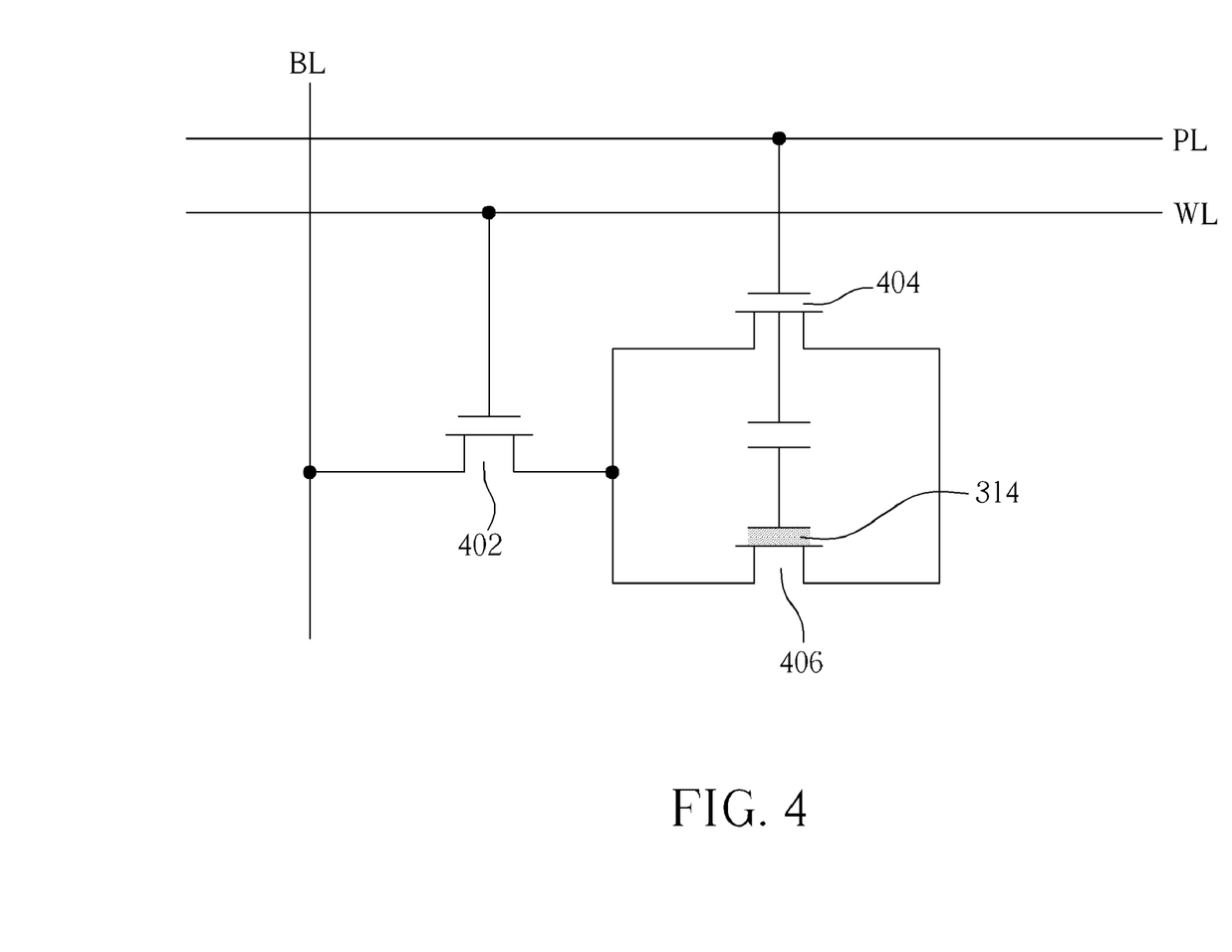
FIG. 4 is a diagram illustrating memory cell with dual functions according to one embodiment of the present invention.
Figure 5:
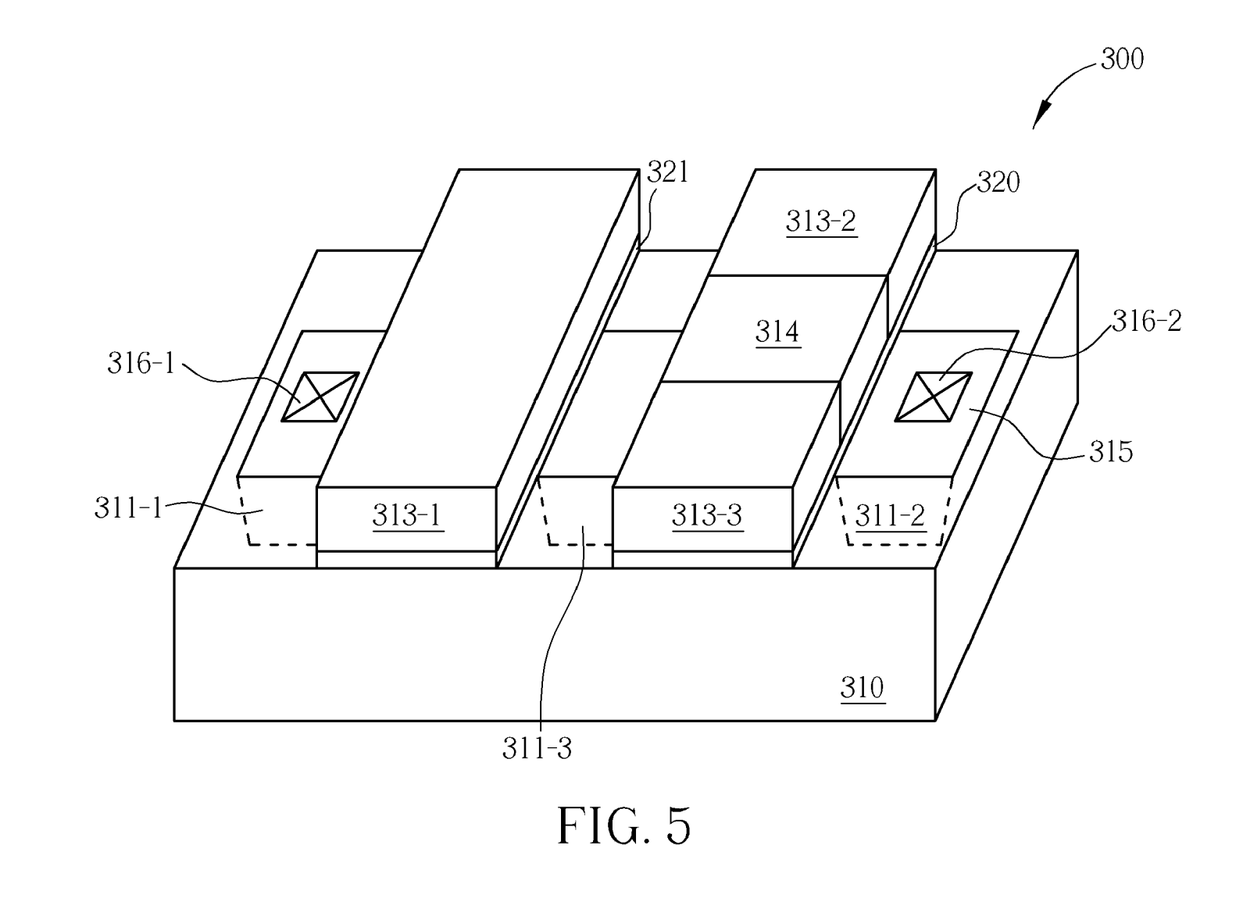
FIG. 5 is a cross-sectional diagram of the memory cell with the dual functions.

Please refer to FIG. 4 and FIG. 5. FIG. 4 is a diagram illustrating the memory cell 300 with dual functions according to one embodiment of the present invention, and FIG. 5 is a cross-sectional diagram of the memory cell 300 with the dual functions. As shown in FIG. 4, a bit line BL is coupled to the contact 316-1, a word line WL is coupled to the first polysilicon gate 313-1, and a program line PL is coupled to the second and the third polysilicon gates 313-2 and 313-3. As shown in FIG. 5 and FIG. 4, the first polysilicon gate 313-1, the first N+ diffusion region 311-1, and the third N+ diffusion region 311-3 can function as a switch 402, the second polysilicon gate 313-2, the third polysilicon gate 313-3, the second N+ diffusion region 311-2, and the third N+ diffusion region 311-3 can function as a one-time programming function cell 404 (that is, the second polysilicon gate 313-2 and the third polysilicon gate 313-3 function as anti-fuses), and the second polysilicon gate 313-2, the third polysilicon gate 313-3, the charge storage layer 314, the second N+ diffusion region 311-2, and the third N+ diffusion region 311-3 can function as a multi-time programming function cell 406.

Figure 6:
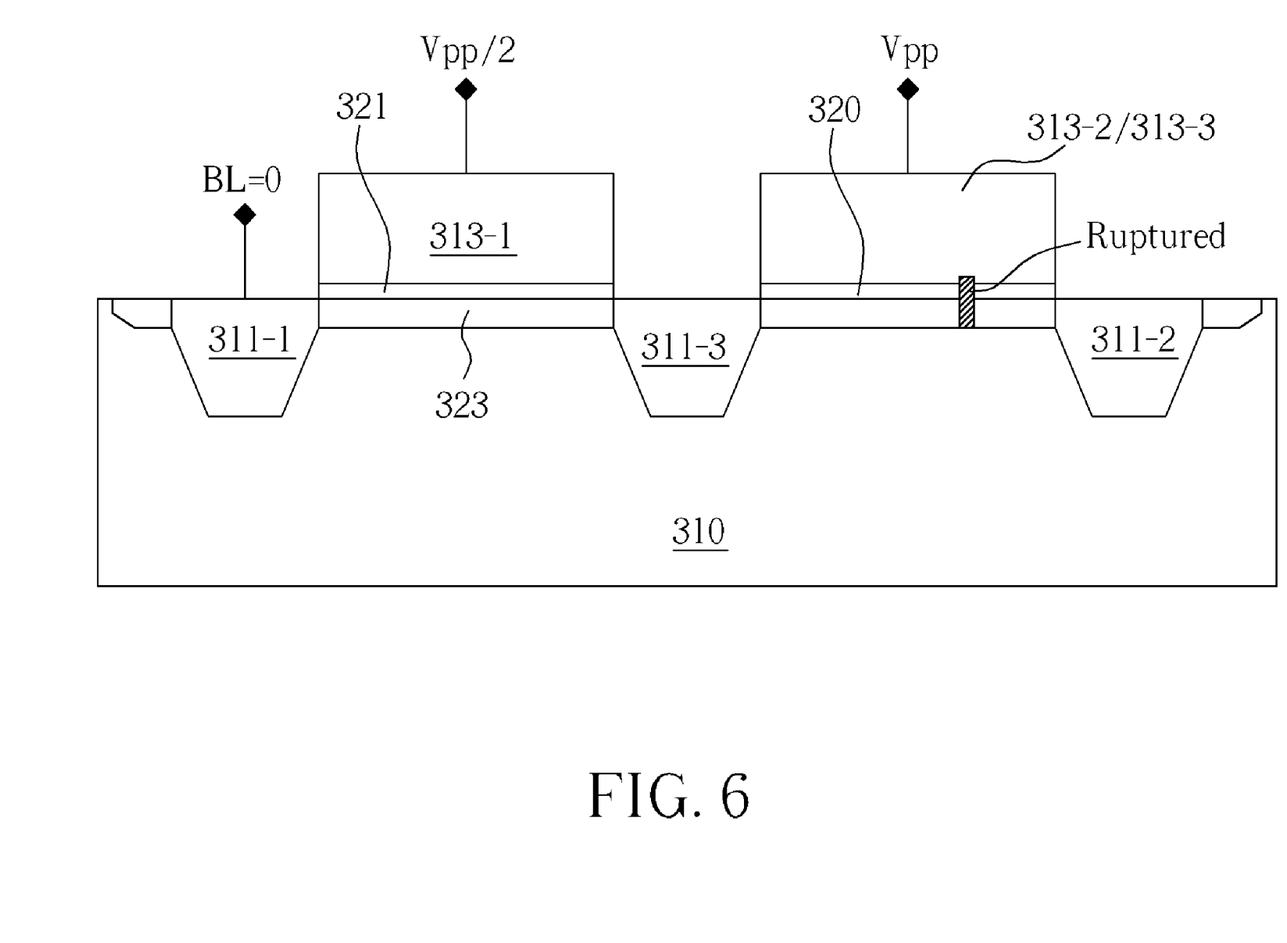
FIG. 6 shows the memory cell in program mode of the one-time programming function.

Please refer to FIG. 6. FIG. 6 shows the memory cell 300 in program mode of the one-time programming function. In the program mode of the one-time programming function, a high voltage Vpp is applied to the second and the third polysilicon gates 313-2, 313-3, and the first N+ diffusion region 311-1 is coupled to ground (that is, the bit line BL coupled to the contact 316-1 has 0 Volt), so the high voltage Vpp can rupture a gate oxide layer 320 formed below the second and third polysilicon gates 313-2, 313-3 according to a voltage drop between the second and third polysilicon gates 313-2, 313-3 and the first N+ diffusion region 311-1. Half the high voltage Vpp is applied to the first polysilicon gate 313-1 to maintain turning-on of a channel region 323 between the first N+ diffusion region 311-1 and the third N+ diffusion region 311-3, and the half of the high voltage Vpp cannot rupture a gate oxide layer 321 formed below the first polysilicon gate 313-1. However, the half of the high voltage Vpp applied to the first polysilicon gate 313-1 can transfer the ground voltage from the first N+ diffusion region 311-1 to the third N+ diffusion region 311-3.

Figure 7:
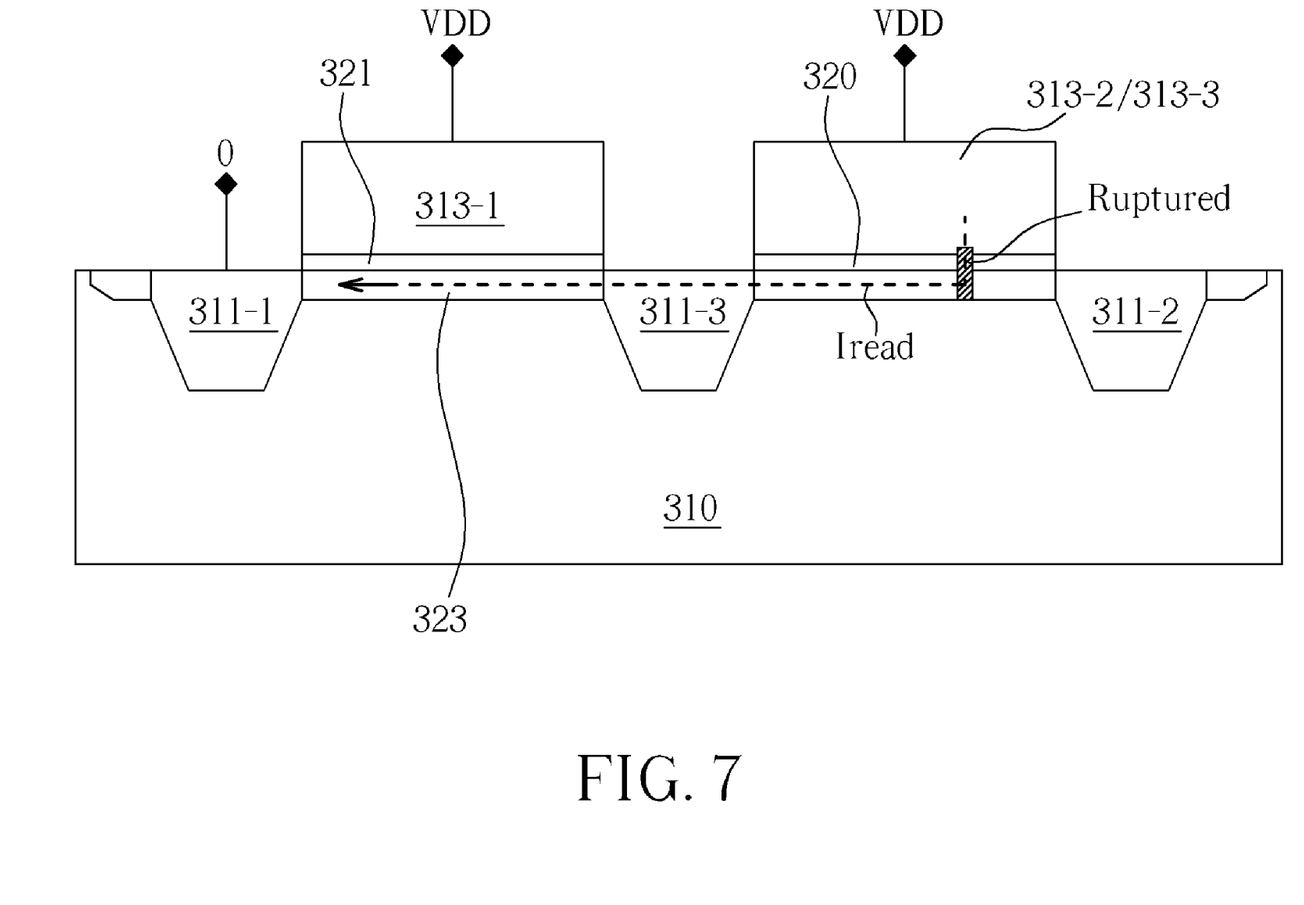
FIG. 7 shows the memory cell in read mode of the one-time programming function.

Please refer to FIG. 7. FIG. 7 shows the memory cell 300 in read mode of the one-time programming function. In the read mode of the one-time programming function, a high voltage VDD is applied to the second and the third polysilicon gates 313-2, 313-3, and the first N+ diffusion region 311-1 is coupled to ground (that is, the bit line BL coupled to the contact 316-1 has 0 Volt), and the high voltage VDD is also applied to the first polysilicon gate 313-1 to maintain turning-on of the channel region 323. In this way, an electrical current Iread may flow from the second and the third polysilicon gates 313-2, 313-3 toward the first N+ diffusion region 311-1. Therefore, the bit line BL can sense current Iread (that is, logic "1"). But, the present invention is not limited to the logic "1" corresponding to the bit line BL sensing current Iread. Thus, in the one-time programming function of the memory cell 300, when the second and the third polysilicon gates 313-2, 313-3 are not ruptured, the memory cell 300 stores logic "0"; when the second and the third polysilicon gates 313-2, 313-3 are ruptured, the memory cell 300 stores the logic "1".

Figure 8:
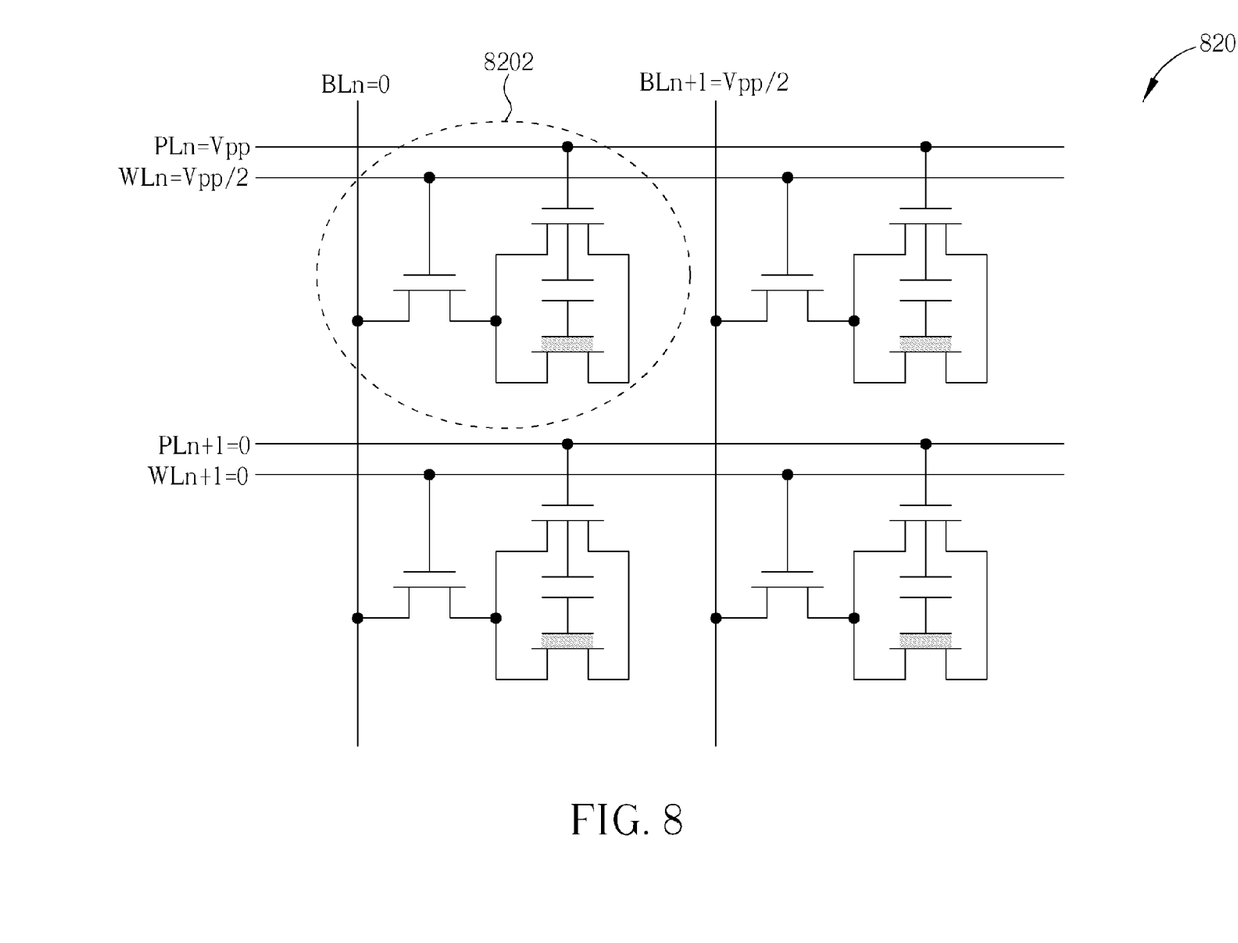
FIG. 8 shows a memory array in the program mode of the one-time programming function.

Please refer to FIG. 8. FIG. 8 shows a memory array 820 in the program mode of the one-time programming function. As shown in FIG. 8, a memory cell 8202 of the memory array 820 is programmed, and other memory cells of the memory array 820 are not programmed. A bit line BLn, a word line WLn, and a program line PLn are coupled to the memory cell 8202. Therefore, the high voltage Vpp is applied to the program line PLn, the bit line BLn is grounded, and half the high voltage Vpp is applied to the word line WLn. Half the high voltage Vpp is applied to bit lines (such as a bit line BLn+1) coupled to other memory cells, and word lines (such as a word line WLn+1) and program lines (such as a program line PLn+1) coupled to other memory cells are grounded. Thus, the memory cell 8202 is programmed (the logic "1"), and other memory cells of the memory array 820 are not programmed (the logic "0").

Figure 9:
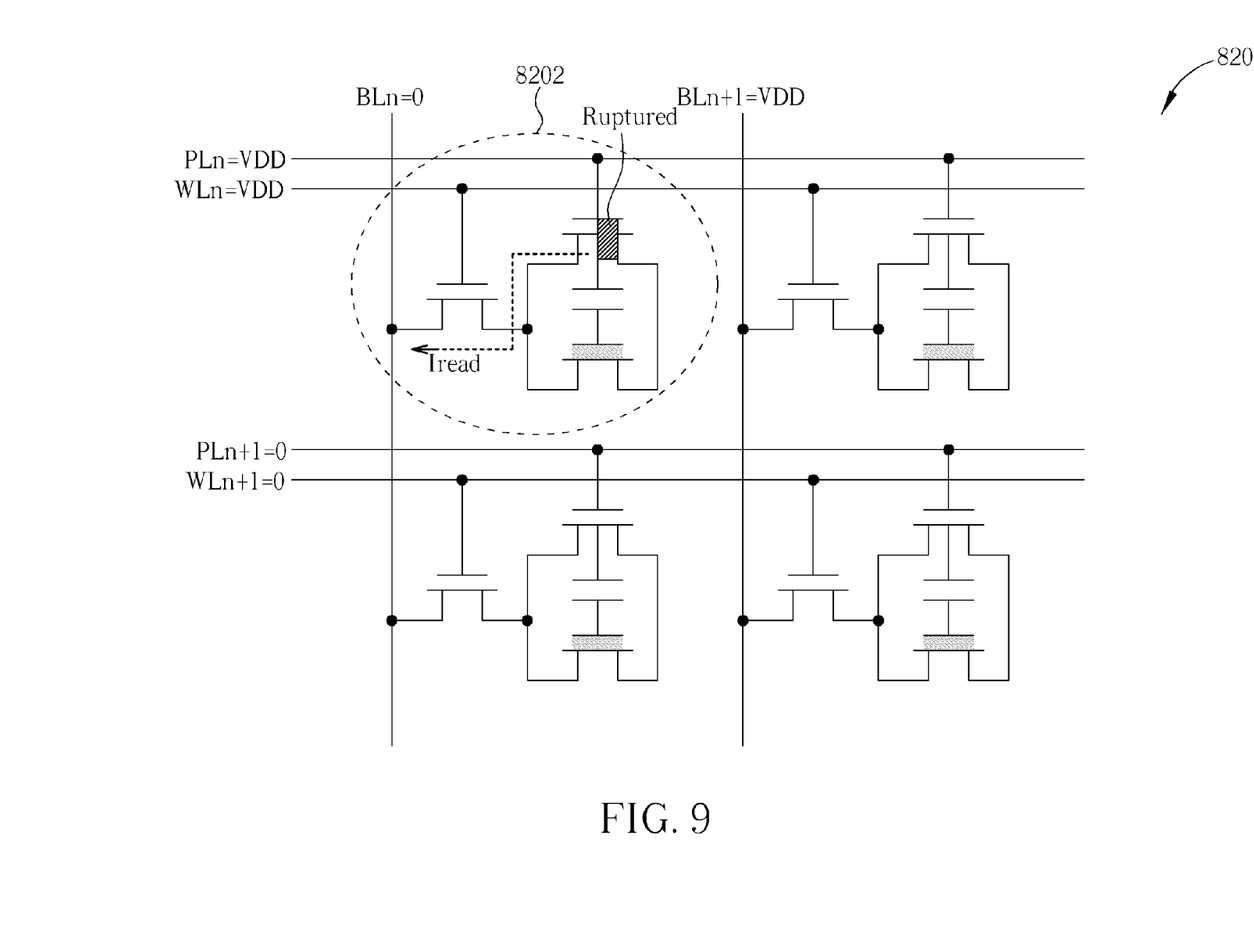
FIG. 9 shows the memory array in the read mode of the one-time programming function.

Please refer to FIG. 9. FIG. 9 shows the memory array 820 in the read mode of the one-time programming function. As shown in FIG. 9, the memory cell 8202 of the memory array 820 stores the logic "1", and other memory cells of the memory array 820 store the logic "0" or the logic "1". In the read mode of the one-time programming function, the high voltage VDD is applied to the program line PLn and the word line WLn, and the bit line BLn is grounded. The high voltage VDD is applied to the bit line BLn+1 to inhibit leakage current in adjacent programmed memory cells coupled to the word line WLn, and the word line WLn+1 and the program line PLn+1 are grounded. Thus, the bit line BLn can sense current Iread (the logic "1" stored in the memory cell 8202).

Figure 3:
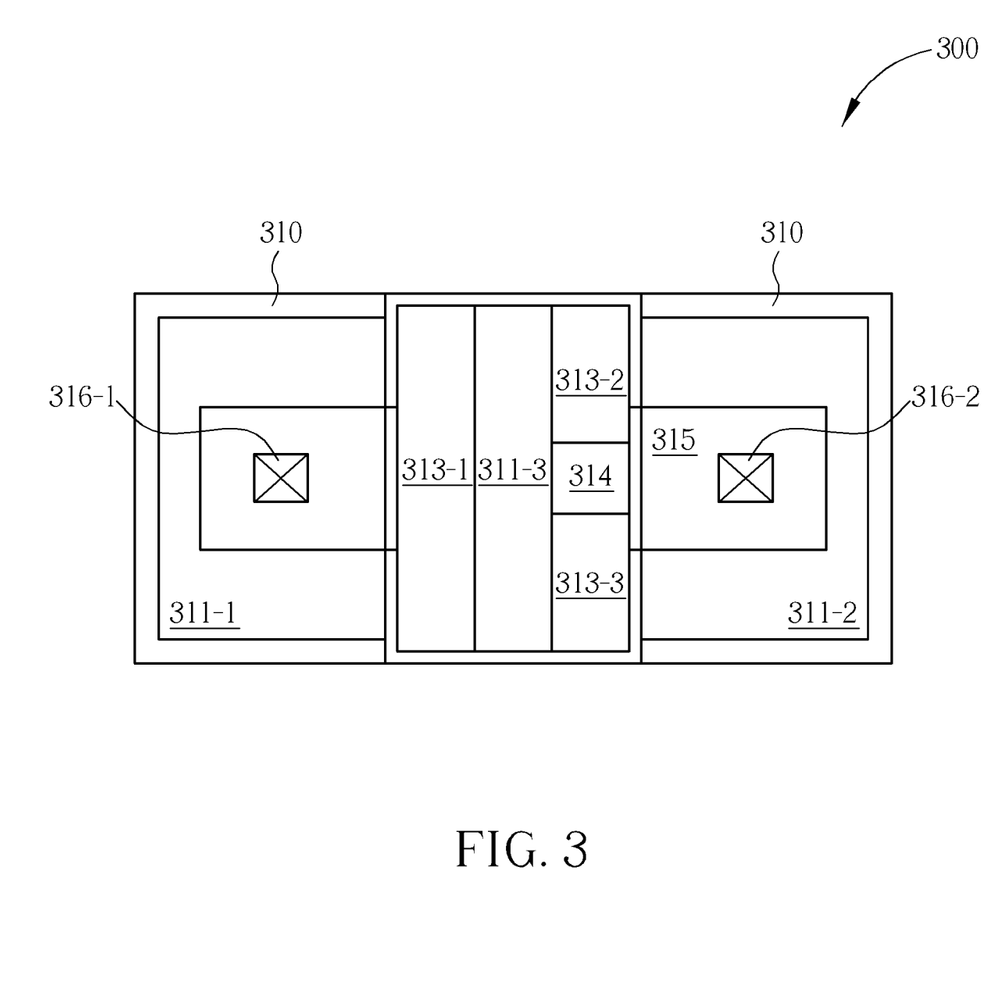
FIG. 3 is a diagram of a complementary metal-oxide-semiconductor non-volatile memory cell according to one embodiment of the present invention.
Figure 10:
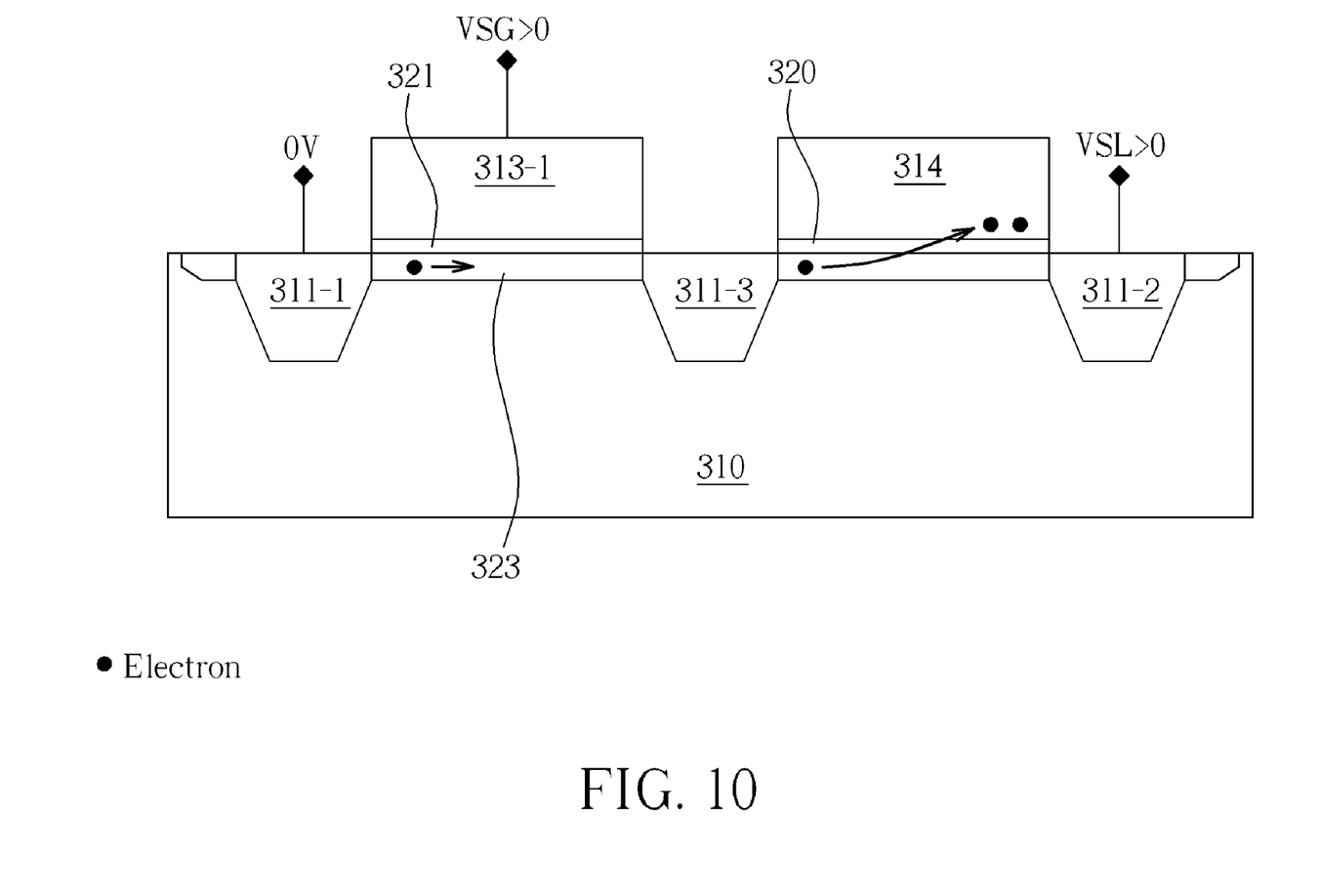
FIG. 10 is a cross-sectional diagram of the CMOS non-volatile memory cell in program mode.

Please refer to FIG. 10, which is a cross-sectional diagram of the CMOS non-volatile memory cell 300 of FIG. 3. FIG. 10 shows the memory cell 300 in program mode of the multi-time programming function. The gate oxide layer 321 may be formed between the first polysilicon gate 313-1 and the P-well region 310. In program mode, for an N-type MOSFET, a high voltage VAG (>0) may be applied to the second polysilicon gate 313-2 and the third polysilicon gate 313-3, a gate voltage VSG larger than the threshold voltage $V_{TH}$ of the memory cell 300 may be applied to the first polysilicon gate 313-1, a high voltage VSL (>0) may be applied to the second N+ diffusion region 311-2, and the first N+ diffusion region 311-1 may be grounded. In this way, channel hot electrons may travel from the first N+ diffusion region 311-1 through the channel region 323 formed between the first N+ diffusion region 311-1 and the third N+ diffusion region 311-3. The channel hot electrons can arrive to the third N+ diffusion region 311-3, and can be injected into the charge storage layer 314 and trapped in the charge storage layer 314. Further, peak channel hot electron injection may be shifted to the area under the charge storage layer 314 next to the second N+ diffusion region 311-2, and current density may be enhanced by applying voltage to the second and third polysilicon gates 313-2, 313-3.

Figure 11:
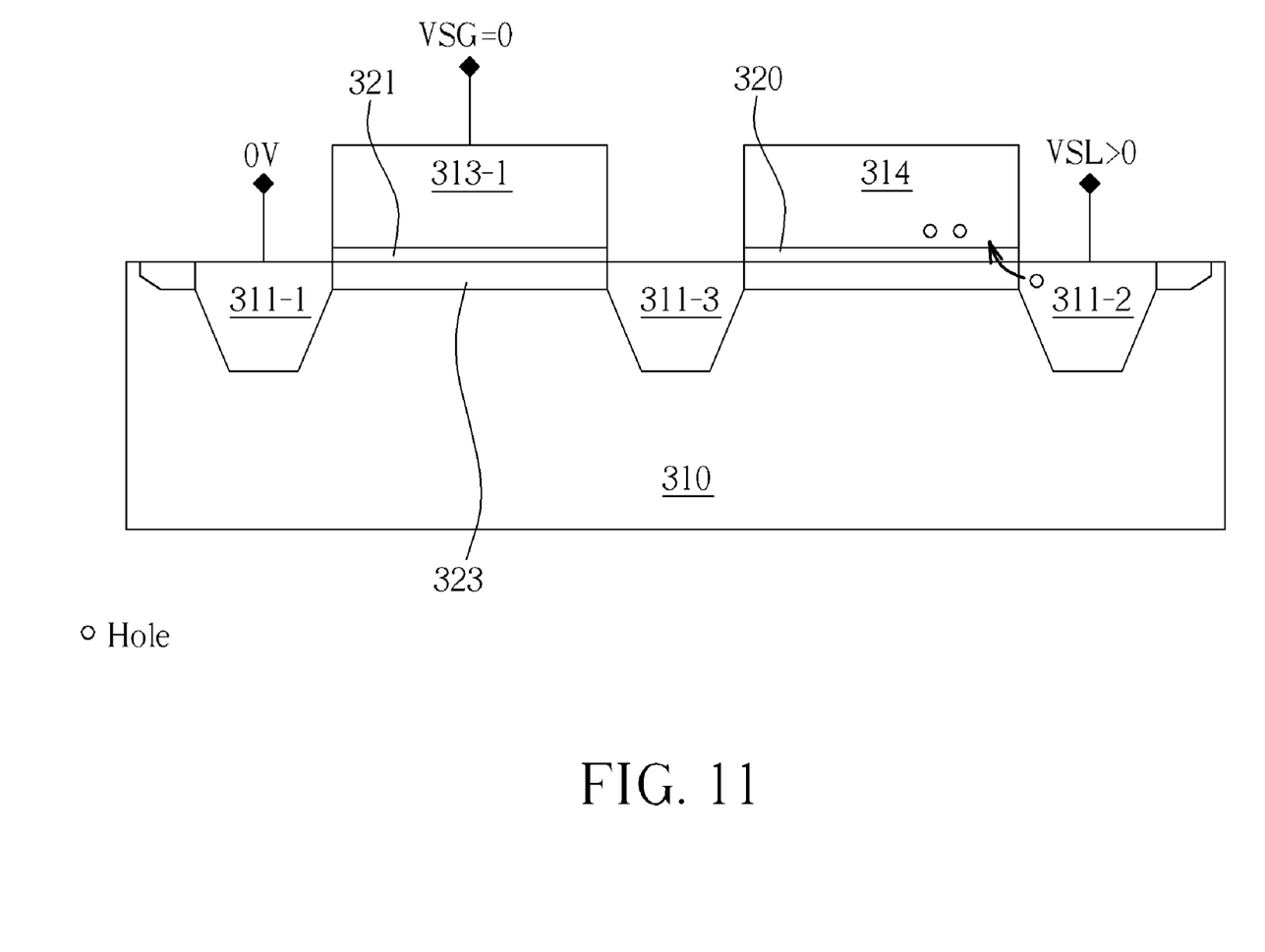
FIG. 11 is a diagram of the CMOS non-volatile memory cell of FIG. 10 in erase mode.

Please refer to FIG. 11, which is a diagram of the CMOS non-volatile memory cell 300 of FIG. 10 in erase mode of the multi-time programming function. Band-to-band tunneling hot hole (BBHH) injection may be utilized to erase the memory cell 300. As shown in FIG. 11, a low voltage VSG (e.g., equal to 0V) may be applied to the first polysilicon gate 313-1, and a low voltage VAG (<0V), may be applied to the second and third polysilicon gates 313-2, 313-3. The first N+ diffusion region 311-1 is floating. A high voltage VSL (>0V) may be applied to the second N+ diffusion region 311-2. In this way, BBHH injection may occur, such that hot holes may travel from the second N+ diffusion region 311-2 to the charge storage layer 314. Therefore, the memory cell 300 can be erased.

Figure 12:
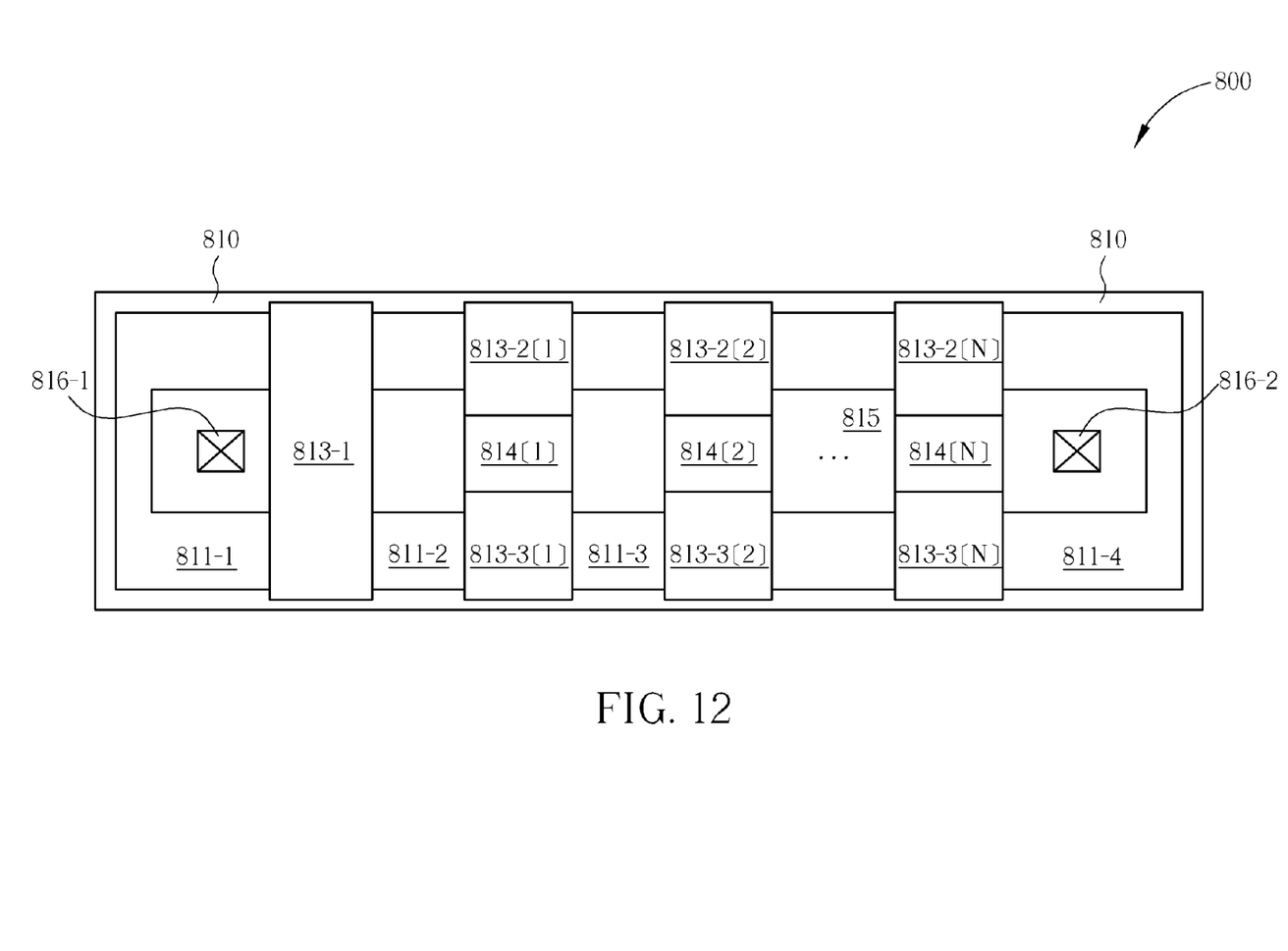
FIG. 12 is a diagram of an array of complementary metal-oxide-semiconductor non-volatile memory cells according to another embodiment of the present invention.

Please refer to FIG. 12, which is a diagram of an array 800 of complementary metal-oxide-semiconductor non-volatile memory cells according to another embodiment of the present invention. The array of memory cells 800 may be considered a logical NAND type array comprising a plurality of memory cells in a memory string. Each memory string may comprise a plurality of memory cells as shown in FIG. 12. The memory cells 800 may be formed over an active region 815 in a P-well region 810 of a substrate. As shown in FIG. 12, a total number N memory cells may be formed. A first N+ diffusion region 811-1 may be formed under a first polysilicon gate 813-1. A second N+ diffusion region 811-2 may be formed under the first polysilicon gate 813-1 and second and third polysilicon gates 813-2 [1], 813-3[1]. A third N+ diffusion region 811-3 may be formed under the second and third polysilicon gates 813-2 [1], 813-3 [1] and under fourth and fifth polysilicon gates 813-2 [2], 813-3[2]. A fourth N+ diffusion region 811-4 may be formed under sixth and seventh polysilicon gates 813-2 [N], 813-3 [N]. To form a continuous channel between the first N+ diffusion region 811-1 and the fourth N+ diffusion region 811-4, each charge storage layer 814[1], 814[2], . . . , 814[N] may store charges, e.g. electrons. If one or more of the charge storage layers 814[1], 814[2], . . . , 814[N] does not store charges, current may not pass from the first N+ diffusion region 811-1 to the fourth N+ diffusion region 811-4. Thus, NAND-type operation may be achieved through use of the architecture shown in FIG. 12.

The second polysilicon gate 813-2 [1] and the third polysilicon gate 813-3 [1] may be formed a first distance apart from each other. Further, the second polysilicon gate 813-2[1] and the third polysilicon gate 813-3 [1] may both be formed a second distance apart from the first polysilicon gate 813-1. The fourth polysilicon gate 813-2 [2] and the fifth polysilicon gate 813-3 [2] may be formed the first distance apart from each other. The fourth polysilicon gate 813-2[2] may be formed a third distance apart from the second polysilicon gate 813-2[1]. The fifth polysilicon gate 813-3 [2] may be formed the third distance apart from the third polysilicon gate 813-3 [1]. The third distance may be the same as the second distance. The first distance may be of a size suitable for forming the self-aligning nitride (SAN) layers 814 [1], 814 [2], . . . , 814 [N] in spaces between the second and third polysilicon gates 813-2[1], 813-3[1], fourth and fifth polysilicon gates 813-2[2], 813-3[2], through the sixth and seventh polysilicon gates 813-2 [N], 813-3[N]. The second distance may be of a size suitable for not forming an SAN layer between the first polysilicon gate 813-1 and the second and third polysilicon gates 813-2 [1], 813-3[1]. The third distance may be of a size suitable for not forming an SAN layer between the second and third polysilicon gates 813-1 [1], 813-3 [1] and the fourth and fifth polysilicon gates 813-2[2], 813-3[2], respectively. For example, in a 90 nm/65 nm node, a range of 20 nm to 200 nm of separation between the second and third polysilicon gates 813-2[1], 813-3[1] may allow formation of a charge storage layer 814[1], e.g. the SAN layer, in the space between the second and third polysilicon gates 813-2[1], 813-3[1]. Contacts 816-1 and 816-2 may be formed in the active region 815 over the diffusion regions 811-1 and 811-4, respectively, for charging the diffusion regions 811-1, 811-4 with voltage signals applied to the contacts 816-1, 816-2.

The above description of FIG. 12 relates to a NAND-type array configuration. A NOR-type array may comprise a plurality of memory cells, each configured as the memory cell 300. Therefore, further description of the NOR-type array is omitted for simplicity.

To sum up, as shown in FIG. 4 to FIG. 11, a memory cell provided by the present invention can have the one-time programming function and the multi-time programming function. That is, different voltages can be applied to a bit line, a word line, and a program line coupled to the memory cell to realize the one-time programming function and the multi-time programming function easily. Thus, compared to the prior art, the memory cell not only has better performance than the prior art, but also has simpler structure to realize the one-time programming function and the multi-time programming function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile semiconductor memory cell with dual functions comprising:
    a substrate of a first conductivity type comprising an active region;
    a first gate formed fully on the active region for receiving a select-gate voltage;
    a second gate formed partially on the active region on a first side of the first gate for receiving a first voltage corresponding to a one-time programming function of the dual function and a second voltage corresponding to a multi-time programming function of the dual function, wherein the first gate and the second gate are separated by a first distance;
    a third gate formed partially on the active region on the first side of the first gate for receiving the first voltage corresponding to the one-time programming function and the second voltage corresponding to the multi-time programming function, wherein the first gate and the third gate are separated by the first distance and the second gate and the third gate are separated by a second distance;
    a charge storage layer formed on a surface of the active region, the charge storage layer filled between the second gate and the third gate;
    a first diffusion region of a second conductivity type opposite the first conductivity type formed on the surface of the active region on a second side of the first gate opposite the first side of the first gate for receiving a third voltage corresponding to the one-time programming function and a fourth voltage corresponding to the multi-time programming function;
    a second diffusion region of the second conductivity type formed on the surface of the active region on a first side of the second gate opposite the first side of the first gate for receiving a fifth voltage corresponding to the multi-time programming function; and
    a third diffusion region of the second conductivity type formed on the surface of the active region between the first gate and the second/third gate.

2. The non-volatile semiconductor memory cell with dual functions of claim 1, wherein the first voltage is used for rupturing an oxide layer below the second gate and the third gate, the select-gate voltage is half the first voltage, and the third voltage is equal to grounded voltage in program mode of the one-time programming function.

3. The non-volatile semiconductor memory cell with dual functions of claim 1, wherein the first voltage is equal to the select-gate voltage, and the third voltage is equal to grounded voltage in read mode of the one-time programming function.

4. The non-volatile semiconductor memory cell with dual functions of claim 1, wherein the second voltage is higher than 0 Volt, the select-gate voltage is higher than 0 Volt, the fourth voltage is equal to 0 Volt, and the fifth voltage is higher than 0 Volt in program mode of the multi-time programming function.

5. The non-volatile semiconductor memory cell with dual functions of claim 1, wherein the second voltage is lower than 0 Volt, the select-gate voltage is equal to 0 Volt, the first diffusion region is floating, and the fifth voltage is higher than 0 Volt in erase mode of the multi-time programming function.

6. The non-volatile semiconductor memory cell with dual functions of claim 1, wherein the first distance and the second distance are in a range suitable for the charge storage layer to be self-aligning.

7. The non-volatile semiconductor memory cell with dual functions of claim 6, wherein the range is from 20 nanometers to 200 nanometers.

* * * * *